(12) United States Patent
Lee

(10) Patent No.: US 6,620,721 B1
(45) Date of Patent: Sep. 16, 2003

(54) METHOD OF FORMING A SELF-ALIGNING PAD

(75) Inventor: Chiu-Te Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/064,039

(22) Filed: Jun. 4, 2002

(51) Int. Cl.[7] .............................................. H11L 21/44
(52) U.S. Cl. ................................................ 438/612
(58) Field of Search ................................ 438/612, 627, 438/687, 688

(56) References Cited

U.S. PATENT DOCUMENTS 6,342,444 B1 * 1/2002 Higashi et al. ............ 438/627
6,376,353 B1 * 4/2002 Zhou et al. ................ 438/612
6,396,151 B1 * 5/2002 Colgan et al. ............. 257/762
6,468,906 B1 * 10/2002 Chan et al. ................ 438/687

* cited by examiner

Primary Examiner—Hoai Ho
Assistant Examiner—Quoc Hoang
(74) Attorney, Agent, or Firm—Winston Hsu

(57) ABSTRACT

A method of forming a bonding pad on a substrate is provided. A first dielectric layer and at least one first conductive layer are included on the substrate. A second conductive layer is formed on the surface of the substrate. Then a heat treatment process is performed to form a third conductive layer in the first and the second conductive layers and completely oxidize the remaining second conductive layer to form a second dielectric layer. Finally a third dielectric layer is formed and each dielectric layer on the first conductive layer is removed.

19 Claims, 9 Drawing Sheets

METHOD OF FORMING A SELF-ALIGNING PAD

BACKGROUND OF INVENTION

1. Field of the Invention

The present invention relates to a method of forming a bonding pad, and more particularly, to a method of forming a self-aligning bonding pad with an alloy process and a photo-etching process (PEP).

2. Description of the Prior Art

In an integrated circuit, each transistor or cell needs to be electrically connected to corresponding metal lines within different metal layers after being formed. Then the transistors are electrically connected to bonding pads through each metal line. After being packaged, the integrated circuit is electrically connected to an external circuit through terminals, which are electrically connected to the bonding pads.

Aluminum alloys with silicon dioxide ($SiO_2$) dielectrics have been the materials of choice for interconnective systems since the dawn of the integrated circuit (IC) era. These materials were convenient to process using mature subtractive etching processes for metal line patterning. However, as ICs have relentlessly marched down the path towards smaller geometry into a deep sub-micron generation in the pursuit of increased speed, the traditional $Al/SiO_2$ interconnective system has shown itself to be a limiting factor. Copper dual-damascene architectures with low-k dielectrics are thus developing and becoming the norm in forming interconnections. Overall, RC delays occurring during signal transmission are reduced and the operating performance is improved because copper has 40% less resistivity than aluminum, and low-k materials reduce the capacitance between interconnections.

However the integrated circuit design cannot produce a marked effect by merely focusing on the materials of the interconnective system. The bonding pad process, prior to the wafer acceptance test (WAT) and the packaging process, has a critical importance. In a bonding process, not only the material selected has an eminent effect on the final product, but the processing steps are also very important. The selection of material affects the physical characteristics of a device directly. The processing include steps such as alloy processing, a cleaning process, and a development process. Thus, parameters in a heat treatment process need be tuned and an acid solution and a developer need be utilized. The quality of the bonding pad is apt to be degraded due to inadequate processing.

In U.S. Pat. No. 6,228,753, Lo et al. proposed a basic method of fabricating a bonding pad. Please refer to FIG. 1 through FIG. 4. FIG. 1 through FIG. 4 are schematic diagrams showing the formation of a bonding pad 16 on a semiconductor wafer according to a prior art method. As shown in FIG. 1, the prior art method is to form at least one conductor 12 on a silicon substrate 11 of the semiconductor wafer 10. The conductor 12 may be a conductive plug, a metal line, a metal interconnection, or a dual-damascence structure.

In FIG. 1, a contact plug is used as an example. Each conductor 12 is disposed in a dielectric layer 14 to be electrically isolated. The material composition of the conductor 12 comprises tungsten (W), copper (Cu), aluminum (Al), an aluminum-copper alloy, or other conductive material. One bonding pad 16 is formed on top of each conductor 12. The bonding pad 16 is substantially composed of copper. A passivation layer 18 is then formed on the semiconductor wafer 10. The material composition of the passivation layer 18 comprises borophosphosilicate glass (BPSG) or silicon nitride. The passivation layer 18 exposes portions of the bonding pad 16.

As shown in FIG. 2, a sacrificial layer 22 is formed on the passivation layer 18 and the bonding pad 16. The sacrificial layer 22 is a positive photo-resistant layer having a thickness of 3000~5000 Å. A photolithography process comprising exposure, development, and etching steps is then performed to form an opening 23 in the sacrificial layer 22, exposing the top surface of the bonding pad 16. It is worth noticing that a hard-bake process is not performed after the etching step of the photolithography process. Therefore the adhesion ability between the sacrificial layer 22 and the passivation layer 18 is not strong at all.

As shown in FIG. 3, an alloy layer 24 is formed on the semiconductor wafer 10. The alloy layer 24 covers the sacrificial layer 22 and the exposed bonding pad 16. The alloy layer 24, composed of an aluminum-copper alloy and having a thickness of 3000~6000 Å, is formed by evaporation or E-beam evaporation (EBE).

As shown in FIG. 4, a supersonic cleaning process is performed with a supersonic cleaner. The semiconductor wafer 10 is positioned in the supersonic cleaner, in which de-ionized water is provided, to remove the sacrificial layer 22 and portions of the alloy layer 24 by supersonic vibrations, without removing the alloy layer 24 on top of the bonding pad 16. Since the sacrificial layer 22, being a positive photo-resistant layer, is not hard-baked, it is loosely adhered to the passivation layer 18. Accordingly, the alloy layer 24 on the sacrificial layer 22 can be simultaneously removed when removing the sacrificial layer 22 with the supersonic vibrations. On the other hand, there is no sacrificial layer 22, with poor adhesion ability, existing between the bonding pad 16 and the alloy layer 24 on the bonding pad 16. Thus, the alloy layer 24 on the bonding pad 16 is not removed when the supersonic vibration cleaning is carried out.

The prior art method of forming the bonding pad is to form an aluminum-copper alloy layer by an alloy process, to improve the bonding ability of the bonding pad 16 due to the many alloy phases of an aluminum-copper alloy and other metals. In addition, the number of cleaning and development processes are reduced. The sacrificial layer 22 and the unwanted alloy layer 24 are removed by utilizing de-ionized water and ultrasonic vibrations to avoid acidic erosion of the portion of the alloy layer 24 on top of the bonding pad 16. However, an edge portion 26 of the bonding pad 16, formed according to the prior art method, always produces an out diffusion phenomenon of copper atoms because the copper material is in contact with the passivation layer 18 directly. As a result, short circuits occur.

SUMMARY OF INVENTION

It is therefore a primary objective of the claimed invention to provide a method of forming a bonding pad, specifically a method utilizing an alloy process and a photo-etching process (PEP) to form a self-aligning bonding pad to resolve the abovementioned problem.

According to the claimed invention, a substrate, including a first dielectric layer and at least one first conductive layer in the first dielectric layer, is provided. Then a second conductive layer is formed on the first conductive layer and the first dielectric layer. Thereafter, a thermal treatment process is performed to form a third conductive layer in the second conductive layer in contact with the first conductive layer, and completely oxidize the remaining second conductive layer to form a second dielectric layer. Next, a third dielectric layer is formed on the second dielectric layer. Finally, a photo-etching process (PEP) is performed to remove portions of the third dielectric layer and portions of the second dielectric layer on the first conductive layer until reaching the top surface of the third conductive layer.

It is an advantage of the claimed invention that the method of forming the bonding pad according to the present invention is to sputter an aluminum layer on the bonding pad and on the dielectric layer surrounding the bonding pad, followed by a heat treatment process. The aluminum layer on top of the bonding pad reacts and becomes a stacked structure, including an aluminum-oxide layer and an aluminum-copper alloy layer. The aluminum layer on top of the dielectric layer surrounding the bonding pad is completely oxidized and becomes an aluminum-oxide layer to be used for self-aligning in a subsequent etching process.

Since the aluminum-copper alloy is a saturate and in a stable phase, copper atoms are not readily inserted into the aluminum-copper alloy structure. The copper atoms in the bonding pad are prevented from diffusing upward, resolving the out diffusion problem occurring at the edge portion of the bonding pad formed according to the prior art method. In addition, the aluminum-copper alloy layer is also used as an etch-stop layer when forming a passivation opening to avoid the non-volatile byproduct produced during copper etching. Because the number of the alloy phases of the aluminum-copper alloy and other metals is greater than the number of the alloy phases of copper and other metals, a better flexibility and feasibility are provided in wire bonding. If gold wires are used as bonding wires, a good bondability results from the excellent solid solubility of the aluminum-copper alloy in gold.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
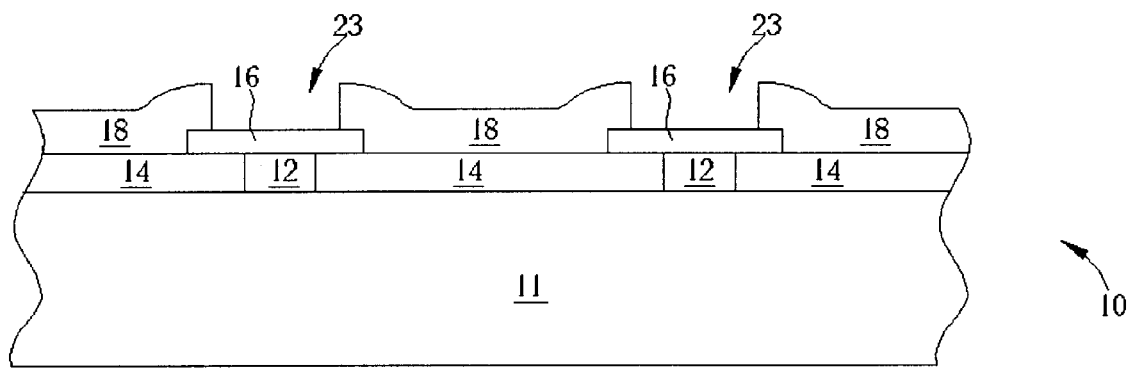
FIG. 1 through FIG. 4 are schematic diagrams showing the formation of a bonding pad on a semiconductor wafer according to a prior art method.
Figure 2:
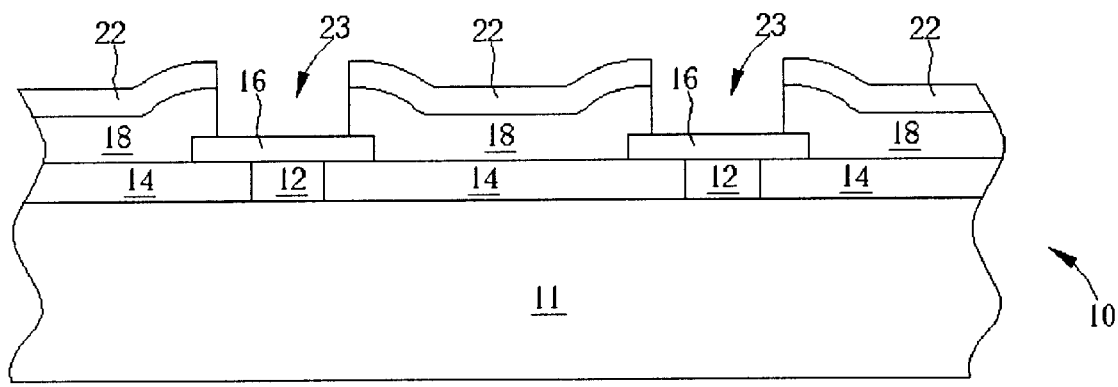
Figure 3:
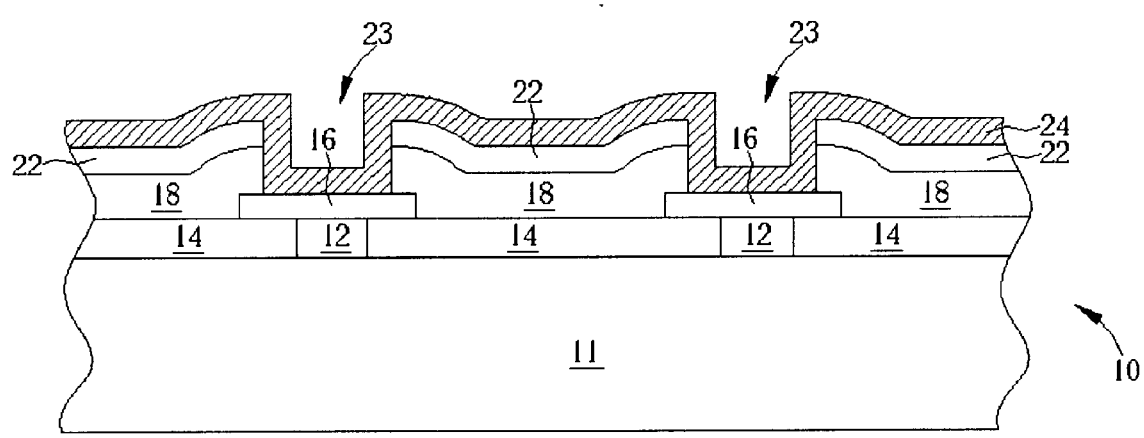
Figure 4:
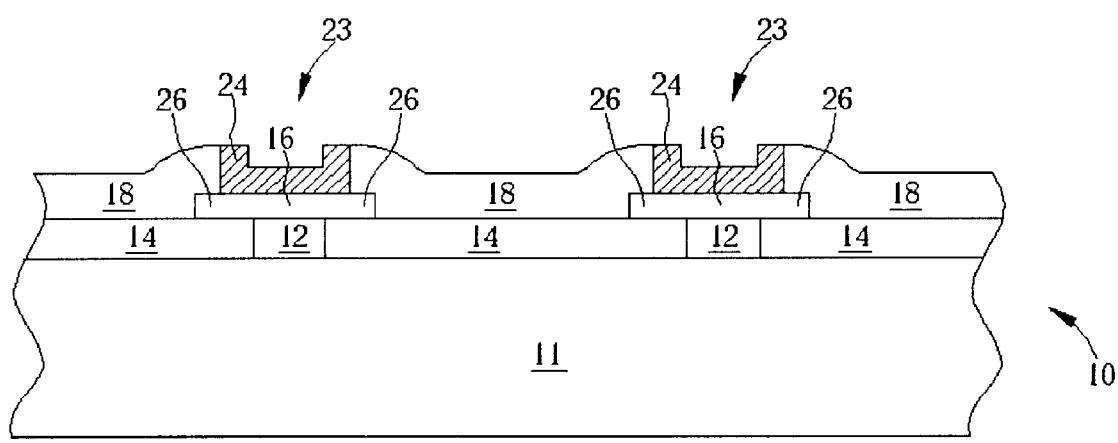
Figure 5:
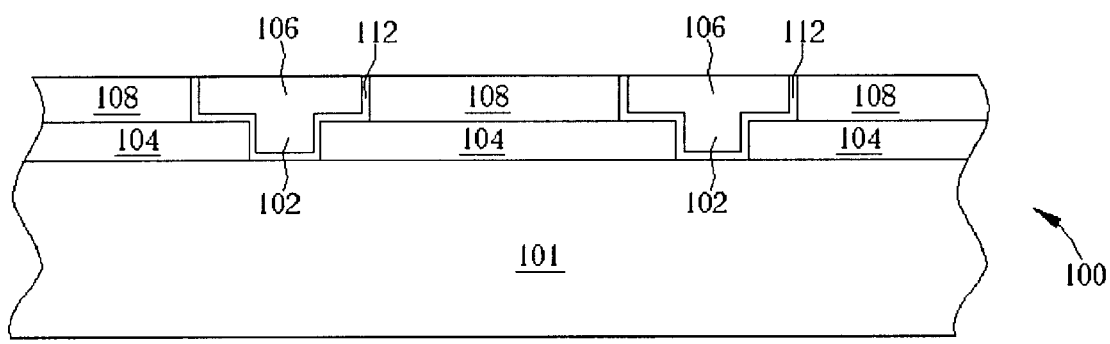
FIG. 5 through FIG. 8 are schematic diagrams showing the formation of a self-aligning bonding pad on a semiconductor wafer according to the present invention method.

Please refer to FIG. 5 through FIG. 8. FIG. 5 through FIG. 8 are schematic diagrams showing the formation of a self-aligning bonding pad on a semiconductor wafer 100 according to the first preferred embodiment of the present invention method. As shown in FIG. 5, the present invention method forms at least one conductor 102 on a silicon substrate 101 of the semiconductor wafer 100. The conductor 102 may be a conductive plug, a metal line, a metal interconnection, or a dual-damascence structure. Each conductor 102 is disposed in a first dielectric layer 104 to be electrically isolated. The material composition of the conductor 102 comprises tungsten (W), copper (Cu), aluminum (Al), an aluminum-copper alloy, or other conductive material.

In FIG. 5, a contact plug is used as an example. At least one metal pad 106 and a second dielectric layer 108 are formed on the first dielectric layer 104. The metal pad 106, composed of copper, is formed on top of each conductor 102. Because of the poor volatile ability of a copper-chloride compound (the plasma of chloride gas is usually utilized for dry etching of metal), the etching process for copper cannot be done in a chemical way. The copper is etched by physical momentum produced by the bombardment of ions in plasma on the copper. Hence, a stacking structure, comprising the conductive plug and the metal pad 106, is a copper dual-damascence structure by a dual-damascence process, skipping the etching process for copper. In addition, the conductor (copper conductive plug) 102 and the copper metal pad 106 are not in contact with the first dielectric layer 104 and the second dielectric layer 108 directly. A barrier layer 112, with a three layered structure of titanium nitride/titanium/titanium nitride (TiN/Ti/TiN), is formed between the conductor (copper conductive plug) 102, the copper metal pad 106, the first dielectric layer 104, and the second dielectric layer 108. The barrier layer 12 prevents copper atoms from diffusing into the first dielectric layer 104 and the second dielectric layer 108.

Figure 6:
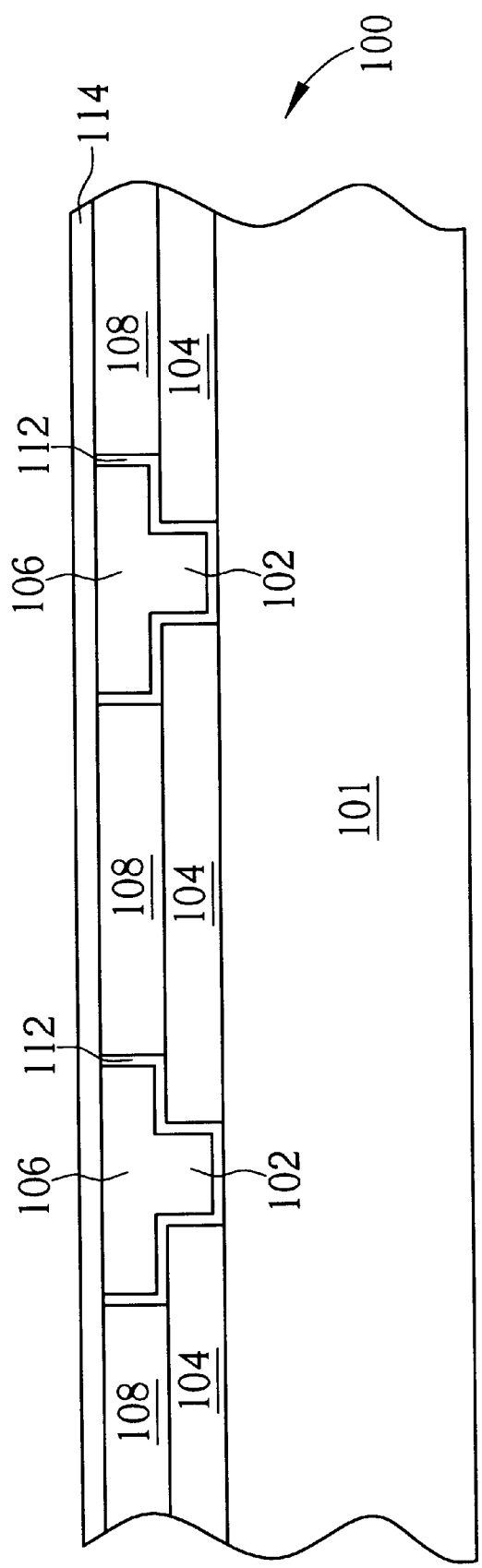

As shown in FIG. 6, an aluminum layer 114, with a thickness of approximately 1 kÅ, is then formed on the second dielectric layer 108 and the Cu metal pad 106 by sputtering. A heat treatment process at a temperature ranging from 400 to 600° C. is thereafter performed. The heat treatment process is performed in a rapid thermal processing chamber (RTP chamber) or in a furnace for approximately 30 minutes. Nitrogen ($N_2$), Argon (Ar), or Oxygen ($O_2$) can be fed into the rapid thermal processing chamber or the furnace to avoid contamination and to help the aluminum layer 114 and the copper atoms diffused from the copper metal pad 106, to form an expected aluminum-copper alloy phase. Therefore, the heat treatment process is regarded as an alloy process.

Figure 7:
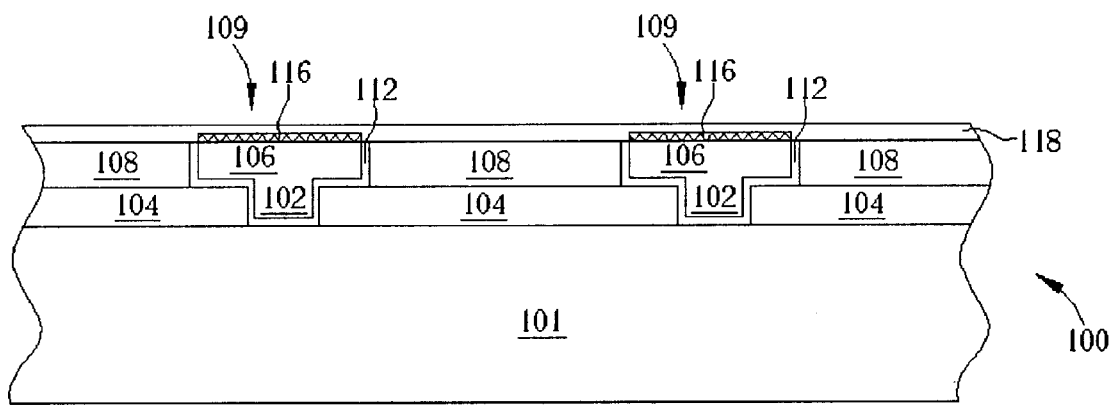

As shown in FIG. 7, since the aluminum metal has a good solid solubility in the copper metal, the aluminum layer 114, originally with a thickness of approximately 1 kÅ, does not exist any more after the alloying process. The aluminum layer 114 on top of the Cu metal pad 106 reacts and becomes an aluminum-copper alloy layer 116 and an aluminum-oxide layer ($Al_2O_3$ layer) having a thickness of 500 Å. The aluminum layer 114 not on top of the copper metal pad 106 is completely oxidized and becomes an aluminum-oxide layer with a thickness of 1 KÅ. In fact, because of the cross diffusion of the aluminum atoms and copper atoms during the heat treatment process, the aluminum-copper alloy phase (not shown) is also formed in the copper metal pad 106 in contact with the aluminum-copper alloy layer 116. The copper metal pad 106 and the aluminum-copper alloy layer 116 constitute the self-aligning bonding pad 109.

Figure 8:
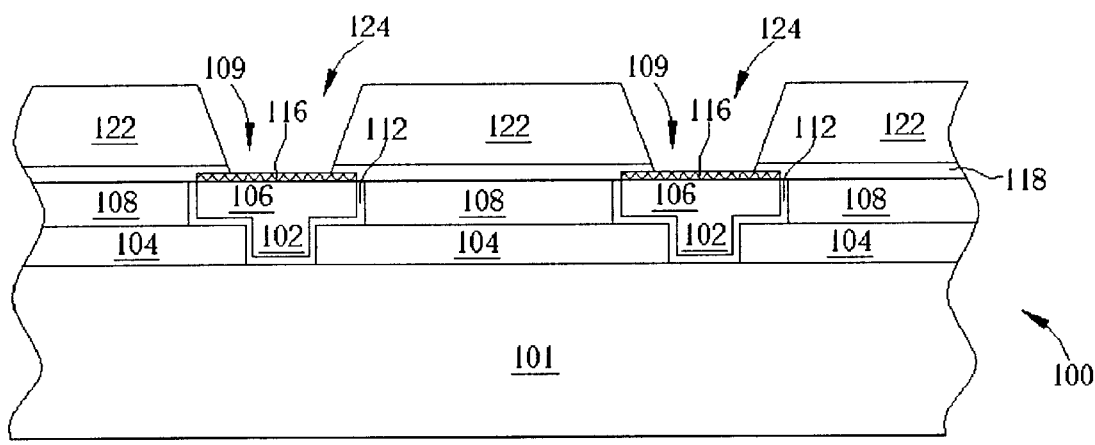

As shown in FIG. 8, a third dielectric layer 122, utilized as a passivation layer, is formed on the aluminum-oxide layer. Then a photo-etching process (PEP) is performed to remove the third dielectric layer 122 and the aluminum-oxide layer 118 on top of the copper metal pad 106, and to form a passivation opening 124 by utilizing a pad mask (not shown) and the aluminum-copper alloy layer 116 as an etch-stop layer. The aluminum-copper alloy layer 116 on top of the copper metal pad 106 is therefore exposed for use as a bonding pad opening so the testing and packaging process are able to be performed. In fact, the aluminum layer 114 may be replaced with another metal layer. The basic requirement for the metal layer is to be able to form a stable alloy phase with copper and to be oxidized into a metal oxide layer after the heat treatment process. The stable alloy phase is required to have a good solid solubility in gold during wire bonding process.

Figure 9:
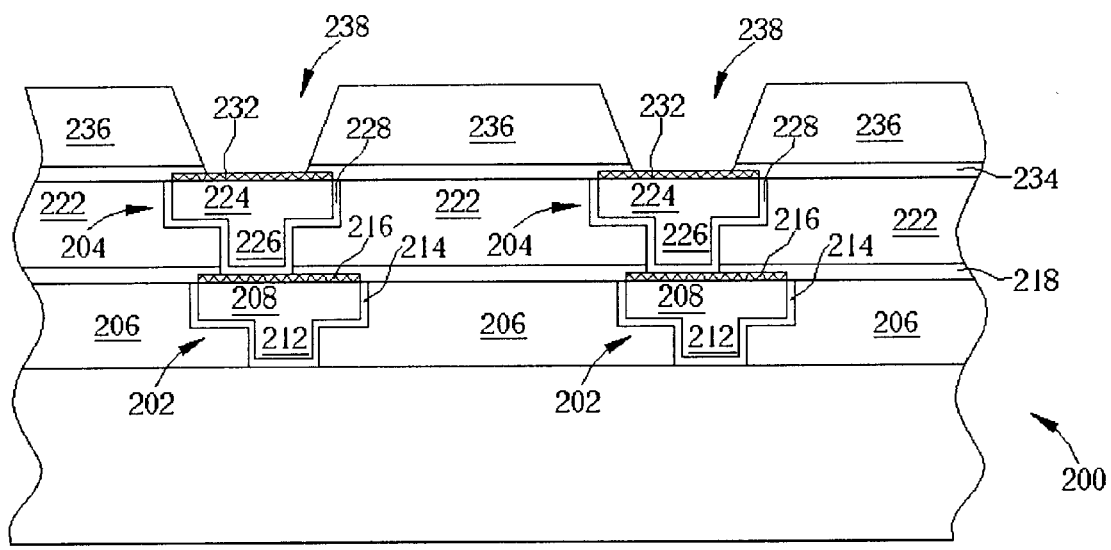
FIG. 9 is a schematic diagram of copper dual-damascence structures on a semiconductor wafer according to the present invention.

Similarly, the present invention method can be applied to any dual-damascence structure when fabricating the integrated circuit and is not limited in the self-aligning bonding pad disclosed in FIG. 5 to FIG. 8. Please refer to FIG. 9. FIG. 9 is a schematic diagram of forming copper dual-damascence structures 202,204 on a semiconductor wafer according to the second preferred embodiment of the present invention. As shown in FIG. 9, at least one copper dual-damascence structure 202 and at least one copper dual-damascence structure 204 are comprised on a semiconductor wafer 200. The stacked copper dual-damascence structure 202, comprising a copper conductive line 208 and a copper contact plug 212, is surrounded by a silicon-dioxide layer ($SiO_2$ layer) 206. A barrier layer 214, with a three layered structure of titanium nitride/titanium/titanium nitride (TiN/Ti/TiN), is formed between the copper metal line 208, the copper contact plug 212 and the silicon-dioxide layer 206. An aluminum-copper alloy layer 216 is on the copper metal line 208. An aluminum-oxide layer 218 is on the silicon-dioxide layer 206 and the aluminum-copper alloy layer 216. In fact, the aluminum-copper alloy phase (not shown) is formed in the copper metal line 208 in contact with the aluminum-copper alloy layer 216.

The aluminum-copper alloy layer 216 in the copper dual-damascence structure 202 is in direct contact with the copper dual-damascence structure 204. The stacked copper dual-damascence structure 204, comprising a copper bonding pad 224 and a copper contact plug 226, is surrounded by a silicon-dioxide layer ($SiO_2$ layer) 222. A barrier layer 228, with a three layered structure of titanium nitride/titanium/titanium nitride (TiN/Ti/TiN), is formed between the copper bonding pad 224, the copper contact plug 226, and the silicon-dioxide layer 222. An aluminum-copper alloy layer 232 is on the copper bonding pad 224. An aluminum-oxide layer 234 is on the silicon-dioxide layer 222 and the aluminum-copper alloy layer 232. In fact, the aluminum-copper alloy phase (not shown) is formed in the copper bonding pad 224 in contact with the aluminum-copper alloy layer 232. A passivation layer 236, with a passivation opening 238, is on the aluminum-oxide layer 234 and aluminum-copper alloy layer 232. The aluminum-copper alloy layer 232 on top of the copper bonding pad 224 is therefore exposed for use as a bonding pad opening so the testing and packaging process can be performed. Of course, a dielectric layer (not shown) and conductors (not shown) disposed in the dielectric layer are underneath the dual-damascence structure 202 and the silicon-dioxide layer 206. Conductors (not shown) may be a conductive plug, a metal line, a metal interconnection, or a dual-damascence structure.

The method of forming the bonding pad according to the present invention is to sputter an aluminum layer on the bonding pad and on the dielectric layer surrounding the bonding pad, followed by a heat treatment process. The aluminum layer on top of the bonding pad reacts and becomes a stacking structure, comprising an aluminum-oxide layer and an aluminum-copper alloy layer. The aluminum layer on top of the dielectric layer surrounding the bonding pad is completely oxidized and becomes an aluminum-oxide layer to be used for self-aligning in a subsequent etching process.

Since the aluminum-copper alloy is a saturate and in a stable phase, copper atoms are not readily inserted into the aluminum-copper alloy structure. Therefore, the copper atoms in the bonding pad are prevented from diffusing upward, resolving the out diffusion problem occurring at the edge portion of the bonding pad formed according to the prior art method. In addition, the aluminum-copper alloy layer is used as an etch-stop layer when forming a passivation opening, to avoid the production of non-volatile byproducts occurring during copper etching. The number of the alloy phases of aluminum-copper alloy and other metals is greater than the number of the alloy phases of copper and other metals, hence a better flexibility and feasibility are provided in wire bonding. For example, when gold wires are used as bonding wires, a good bondability results from the excellent solid solubility of an aluminum-copper alloy in gold.

In contrast to the prior art method of forming the bonding pad, the present invention is to sputter an aluminum layer on the bonding pad and on the dielectric layer surrounding the bonding pad, followed by a heat treatment process. The aluminum layer on top of the bonding pad reacts and becomes a stacking structure, comprising an aluminum oxide layer and an aluminum-copper-alloy layer. The aluminum layer on top of the dielectric layer surrounding the bonding pad is completely oxidized and becomes an aluminum oxide layer used for self-aligning in a subsequent etching process. Because the aluminum-copper alloy is a saturate, in a stable phase, and copper atoms are not readily inserted into the aluminum-copper alloy structure, copper atoms in the bonding pad are prevented from diffusing upward, resolving the out diffusion problem occurring at the edge portion of the bonding pad formed according to the prior art method. The aluminum-copper alloy layer is also used as an etch-stop layer when forming a passivation opening and to avoid the production of non-volatile byproducts occurring during Cu etching. Because the number of alloy phases of an aluminum-copper alloy and other metals is greater than the number of the alloy phases of copper and other metals, better flexibility and feasibility are therefore provided in wire bonding. If gold wires are used as bonding wires, a good bondability results from the excellent solid solubility of an aluminum-copper alloy in gold.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a self-aligning pad on a substrate, the substrate comprising a first dielectric layer and at least one first conductive layer in the first dielectric layer, the method comprising:

forming a second conductive layer on the first conductive layer and the first dielectric layer;

performing a thermal treatment process to form a third conductive layer in the second conductive layer in contact with the first conductive layer, and completely oxidize the remaining second conductive layer to form a second dielectric layer;

forming a third dielectric layer on the second dielectric layer; and performing a photo-etching-process (PEP) to remove portions of the third dielectric layer and portions of the second dielectric layer on the first conductive layer until reaching the top surface of the third conductive layer.

2. The method of claim 1 wherein the substrate is a semiconductor substrate, the substrate further comprising a fourth dielectric layer disposed underneath the bottom of the first dielectric layer and a conductor disposed in the fourth dielectric layer to electrically connect the first conductive layer.

3. The method of claim 2 wherein the conductor comprises a conductive plug, a metal line, a metal interconnection or a dual damascence structure conductor, and the material composition of the conductor comprising tungsten (W), copper (Cu), aluminum (Al), an aluminum-copper alloy, or other conductive material.

4. The method of claim 1 wherein the first conductive layer is a copper metal layer, and the third conductive layer is used as a barrier layer for the copper metal layer to prevent copper atoms in the copper metal layer from diffusing upwards.

5. The method of claim 4 wherein the second conductive layer is an aluminum layer and the third conductive layer is an aluminum-copper alloy layer.

6. The method of claim 5 wherein the heat treatment process comprises a rapid thermal processing or a furnace process, and the temperature of the heat treatment process is 400~600° C.

7. The method of claim 6 wherein the second conductive layer is a metal layer having a good solid solubility in copper.

8. The method of claim 1 wherein a portion of the third conductive layer is simultaneously formed in the first conductive layer in contact with the second conductive layer.

9. The method of claim 1 wherein the third conductive layer is used as a stop layer for the photo-etching process.

10. The method of claim 1 wherein the first conductive layer and the third conductive layer constitute a self-aligning bonding pad.

11. A method of forming a conductive layer on a substrate, the substrate comprising a first dielectric layer and at least one first metal layer in the first dielectric layer, the method comprising:

forming a second metal layer on the first metal layer and the first dielectric layer;

performing a thermal treatment process to cross-diffuse the metal atoms in the second metal layer and the first metal layer to form an alloy layer, and completely oxidize the second metal layer to form a metal oxide layer;

forming a second dielectric layer on the metal oxide layer; and performing a photo-etching process to remove portions of the second dielectric layer and portions of the metal oxide layer on the first metal layer until reaching the top surface of the alloy layer.

12. The method of claim 11 wherein the substrate is a semiconductor substrate, the semiconductor substrate further comprises a third dielectric layer disposed underneath the bottom of the first dielectric layer and a conductor disposed in the third dielectric layer to electrically connect the first metal layer.

13. The method of claim 12 wherein the conductor comprises a conductive plug, a metal line, a metal interconnection or a dual-damascence structure conductor, and the material composition of the conductor comprises tungsten (W), copper (Cu), aluminum (Al), an aluminum-copper alloy, or other conductive material.

14. The method of claim 11 wherein the first metal layer is a copper metal layer, and the alloy layer is used as a barrier layer for the copper metal layer to prevent copper atoms in the copper metal layer from diffusing upwards.

15. The method of claim 14 wherein the second metal layer is an aluminum layer and the alloy layer is an aluminum-copper alloy layer.

16. The method of claim 15 wherein the heat treatment process comprises a rapid thermal processing or a furnace process, and the temperature of the heat treatment process is 400~600° C.

17. The method of claim 11 wherein the second metal layer is a metal layer having a good solid solubility in the first metal layer.

18. The method of claim 11 wherein the alloy layer is used as a stop layer for the photo-etching process.

19. The method of claim 11 wherein the first metal layer and the alloy layer constitute a self-aligning bonding pad.

* * * * *